(12) United States Patent
Lin

(10) Patent No.: US 10,403,369 B2
(45) Date of Patent: Sep. 3, 2019

(54) MEMORY SYSTEM WITH FILE LEVEL SECURE ERASE AND OPERATING METHOD THEREOF

(71) Applicant: SK hynix Inc., Gyeonggi-do OT (KR)

(72) Inventor: Chris C. Lin, San Jose, CA (US)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/727,085

(22) Filed: Oct. 6, 2017

(65) Prior Publication Data
US 2018/0108419 A1    Apr. 19, 2018

Related U.S. Application Data

(60) Provisional application No. 62/409,205, filed on Oct. 17, 2016.

(51) Int. Cl.
| | |
|---|---|
| *G11C 16/16* | (2006.01) |
| *G06F 1/3225* | (2019.01) |
| *G06F 3/06* | (2006.01) |
| *G11C 7/20* | (2006.01) |
| *G11C 8/08* | (2006.01) |
| *G11C 11/56* | (2006.01) |
| *G11C 16/04* | (2006.01) |
| *G11C 16/34* | (2006.01) |
| *G11C 16/10* | (2006.01) |
| *G11C 16/22* | (2006.01) |
| *G11C 29/04* | (2006.01) |

(52) U.S. Cl.
CPC .......... *G11C 16/16* (2013.01); *G06F 1/3225* (2013.01); *G06F 3/0608* (2013.01); *G06F 3/0652* (2013.01); *G06F 3/0679* (2013.01); *G11C 7/20* (2013.01); *G11C 8/08* (2013.01); *G11C 11/5628* (2013.01); *G11C 11/5635* (2013.01); *G11C 16/0483* (2013.01); *G11C 16/10* (2013.01); *G11C 16/22* (2013.01); *G11C 16/3445* (2013.01); *G11C 2029/0411* (2013.01)

(58) Field of Classification Search
CPC .......... G11C 16/04; G11C 16/16; G11C 8/08; G11C 11/5635; G11C 16/22; G11C 16/3445; G06F 1/3225; G06F 3/0608
See application file for complete search history.

(56) References Cited

U.S. PATENT DOCUMENTS

| | | | | |
|---|---|---|---|---|
| 5,933,847 A | * | 8/1999 | Ogawa | G06F 12/0246 |
| | | | | 711/103 |
| 2009/0024810 A1 | * | 1/2009 | Ito | G06F 12/0246 |
| | | | | 711/159 |

(Continued)

*Primary Examiner* — Masud K Khan
(74) *Attorney, Agent, or Firm* — IP & T Group LLP

(57) ABSTRACT

An apparatus of a memory system and an operating method thereof include: a plurality of memory devices, wherein each of the plurality of memory devices includes a plurality of blocks, each of the plurality of blocks has multiple pages corresponding to multiple wordlines, respectively; and a memory controller coupled with the plurality of memory devices, wherein the memory controller is configured to determine an overhead of an erase block where a deleted file resides therein, perform file level secure erase operation on the erase block in accordance with at least the overhead, and mark target pages corresponding to the deleted file as "trimmed" in a logic block address (LBA) table.

17 Claims, 6 Drawing Sheets

(56) References Cited

U.S. PATENT DOCUMENTS

| | | | |
|---|---|---|---|
| 2010/0077136 A1* | 3/2010 | Ware | G06F 12/0246 |
| | | | 711/103 |
| 2012/0221776 A1* | 8/2012 | Yoshihashi | G06F 12/0804 |
| | | | 711/103 |
| 2013/0336063 A1 | 12/2013 | Kim | |
| 2014/0063938 A1* | 3/2014 | Oh | H01L 27/11524 |
| | | | 365/185.02 |
| 2015/0012785 A1* | 1/2015 | Gurgi | G11C 11/5635 |
| | | | 714/718 |
| 2015/0331627 A1* | 11/2015 | Kwak | G11C 11/5628 |
| | | | 711/103 |
| 2017/0148493 A1* | 5/2017 | Chang | G11C 7/00 |
| 2017/0300410 A1* | 10/2017 | Zhang | G06F 12/0253 |

\* cited by examiner

MEMORY SYSTEM WITH FILE LEVEL SECURE ERASE AND OPERATING METHOD THEREOF

CROSS REFERENCE TO OTHER APPLICATIONS

This application claims priority to U.S. Provisional Patent Application No. 62/409,205 entitled FILE LEVEL SECURE ERASE IN SSD filed Oct. 17, 2016, which is incorporated herein by reference for all purposes.

BACKGROUND

Field of Invention

Exemplary embodiments of the present invention relate to an apparatus of semiconductor memory storage system, and more particularly to file security in NAND and an operation method thereof.

Description of Related Arts

The computer environment paradigm has shifted to ubiquitous computing systems that can be used anytime and anywhere. Due to this fact, the use of portable electronic devices such as mobile phones, digital cameras, and notebook computers has rapidly increased. These portable electronic devices generally use a memory system having memory devices, that is, a data storage device. The data storage device is used as a main memory device or an auxiliary memory device of the portable electronic devices. Thus, the reliability and security of digital data storage, such as a memory system, is critical.

Data storage devices using memory devices provide excellent stability, durability, high information access speed, and low power consumption, since they have no moving parts. Examples of data storage devices having such advantages include universal serial bus (USB) memory devices, memory cards having various interfaces, and solid state drives (SSD).

The SSD can include various flash memory components. The two main types of flash memory components are named after the NAND and NOR logic gates. The individual flash memory cells exhibit internal characteristics similar to those of the corresponding gates. The NAND-type flash memory may be written and read in blocks (or pages) which are generally much smaller than the entire device. The NAND-type operates primarily in memory cards, USB flash drives, solid-state drives, and similar products, for general storage and transfer of data.

File security is always a very important component of any storage solution. Secure erase of a disk is particularly crucial and needs to follow published standards for disks to be considered securely erased.

Thus, there remains a need for a semiconductor memory system and operating method thereof having a secure erase mechanism. In view of the ever-increasing need to improve performance and security, it is more and more critical that answers be found to these problems. Solutions to these problems have been long sought but prior developments have not taught or suggested any solutions and, thus, solutions to these problems have long eluded those skilled in the art.

SUMMARY

Embodiments of the present disclosure are directed to a semiconductor memory system and an operating method thereof capable of improving the performance and reliability of a memory system.

In accordance with an embodiment of the present disclosure, there is provided with an apparatus of a memory system which includes: a plurality of memory devices, wherein each of the plurality of memory devices includes a plurality of blocks, each of the plurality of blocks has multiple pages corresponding to multiple wordlines, respectively; and a memory controller coupled with the plurality of memory devices, wherein the memory controller is configured to determine an overhead of an erase block where a deleted file resides therein, perform file level secure erase operation on the erase block in accordance with at least the overhead, and mark target pages corresponding to the deleted file as "trimmed" in a logic block address (LBA) table.

In accordance with an embodiment of the present disclosure, there is provided with a method of operating a semiconductor memory system which includes: determining an overhead of an erase block where a deleted file resides therein; performing file level secure erase operation on the erase block in accordance with at least the overhead; and marking target pages corresponding to the deleted file as "trimmed" in a logic block address (LBA) table.

In accordance with an embodiment of the present disclosure, there is provided with a memory system which includes: a processor; a non-transitory computer readable storage medium coupled to the processor, embedding computer program products executed by the processor, including computer instructions configured to: determine an overhead of an erase block where a deleted file resides therein, perform file level secure erase operation on the erase block in accordance with at least the overhead, and mark target pages corresponding to the deleted file as "trimmed" in a logic block address (LBA) table.

DETAILED DESCRIPTION

Figure 1:
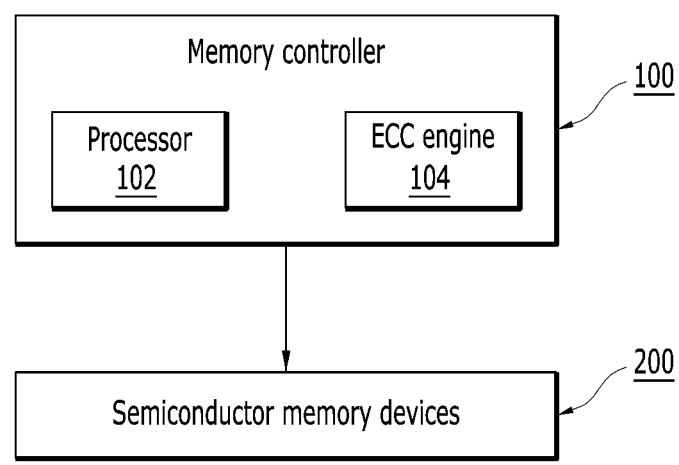
FIG. 1 is a top level block diagram schematically illustrating a semiconductor memory system in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The invention can be implemented in numerous ways, including as a process; an apparatus; a system; a composition of matter; a computer program product embodied on a computer readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily suitable for performing the task at a given time or a specific component that is manufactured to perform the task. As used herein, the term 'processor' refers to one or more devices, circuits, and/or processing cores suitable for processing data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Security is always a very important component of any storage solution. Secure erase of a disk is particularly crucial that published standards may need to be followed for disks to be considered as securely erased. In the SSD, whole drive secure erase can be relatively easy by changing the Advanced Encryption Standard (AES) key that is used to encrypt the entire drive. Similarly, a namespace, such as a range of the entire logical block address (LBA), can be securely erased by Non-Volatile Memory Express (NVMe) Format of Non-Volatile Memory (NVM) command with the Cryptographic Erase setting, which basically changes the AES key of the namespace. However, it is much harder to securely erase at the file level when only a few files are deleted, than at the block/drive level.

One possible solution can be trimming the LBAs of the deleted files and then forcing garbage collection of the entire block or blocks where the deleted files reside in. But the overhead is huge when most pages of the block where the deleted files reside in are valid and need to be relocated to a different block.

Referring now to FIG. 1, therein is shown a top-level block diagram schematically illustrating a memory system in accordance with an embodiment of the present invention. The memory system can include numerous components including a memory controller 100, and semiconductor memory devices 200, such as flash memory devices. The memory controller 100 can comprise a processor 102 for executing programs and instructions stored in the memory system for operating the memory system. The processor 102 may comprise an ECC engine or ECC controller 104. Alternatively, the ECC controller 104 can be located inside the processor 102.

The memory controller 100 may control overall operations of the semiconductor memory devices 200, via a communication input/output (I/O) bus comprises command CMD, address ADDR, data DATA, power PWR, and a control signal CTRL. The control signal CTRL may include a command latch enable (CLE) signal, an address latch enable (ALE) signal, a chip enable (CE) signal, a write enable (WE) signal, a read enable (RE) signal, and so on.

The semiconductor memory devices 200 may perform one or more erase, program, write, and read operations under the control of the memory controller 100. The semiconductor memory devices 200 may receive the command, address, and data through input/output lines from the memory controller 100. The semiconductor memory devices 200 may receive the power PWR through a power line and the control signal CTRL through a control line.

The memory controller 100 and the semiconductor memory devices 200 may be integrated in a single semiconductor device such as the SSD or a memory card. For example, the memory controller 100 and the semiconductor memory devices 200 may be integrated in a single semiconductor device to configure a memory card such as a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMC micro), a secure digital (SD) card, a mini secure digital (mini SD) card, a micro secure digital (microSD) card, a secure digital high capacity (SDHC), and a universal flash storage (UFS).

For another example, the memory system may be provided as one of various elements including an electronic device such as a computer, an ultra-mobile PC (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, one of electronic devices of a home network, one of electronic devices of a computer network, one of electronic devices of a telematics network, a radio-frequency identification (RFID) device, or elements devices of a computing system.

Figure 2:
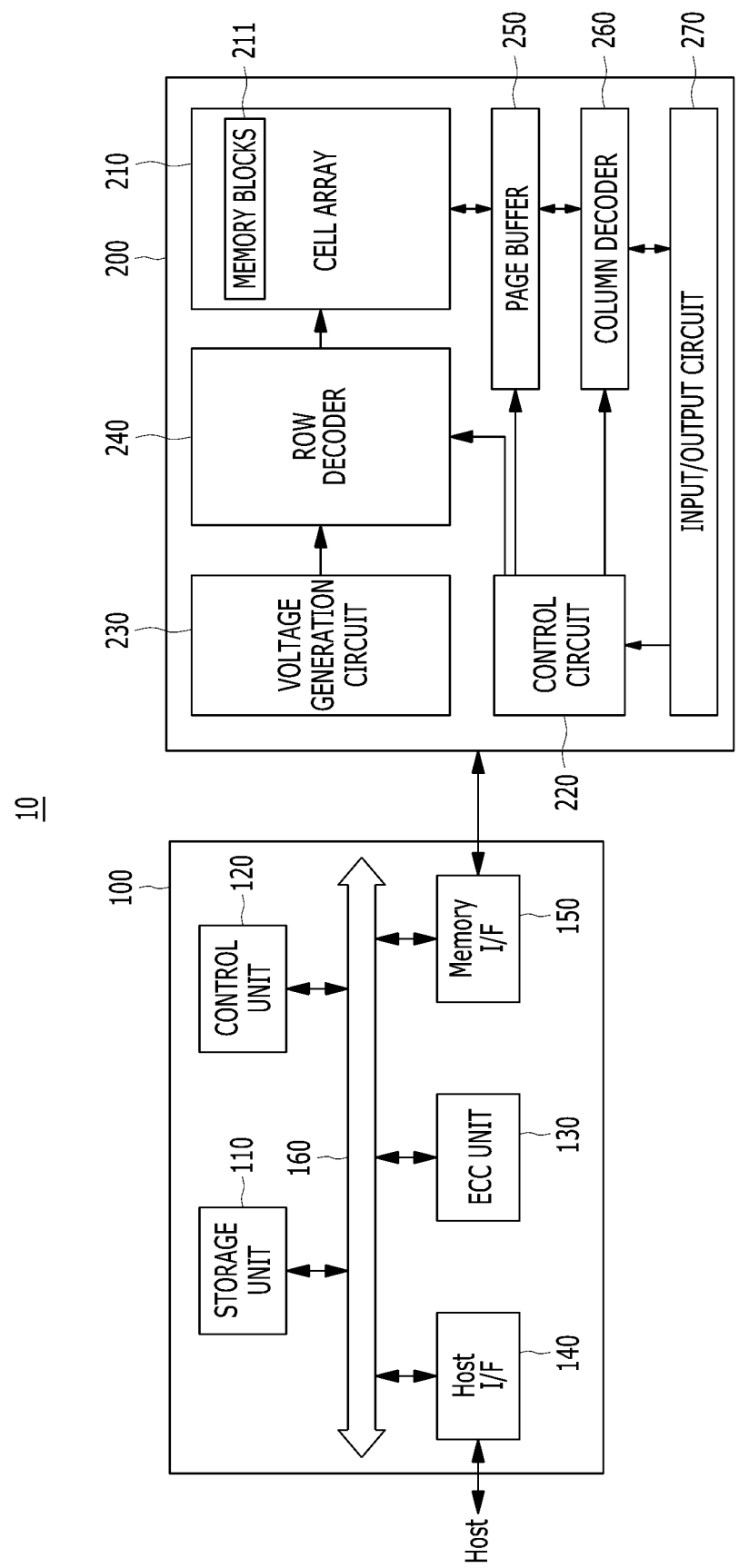
FIG. 2 is a detailed block diagram illustrating a semiconductor memory system in accordance with an embodiment of the present invention.

Referring now to FIG. 2, therein is shown a detailed block diagram illustrating a memory system in accordance with an embodiment of the present invention. For example, the memory system of FIG. 2 may depict the memory system shown in FIG. 1. The memory system may include the memory controller 100 and the semiconductor memory devices 200. The memory system may operate in response to a request from a host device, and in particular, store data to be accessed by the host device.

The host device may be implemented with any one of various kinds of electronic devices. In some embodiments, the host device may include an electronic device such as a desktop computer, a workstation, a three-dimensional (3D)

television, a smart television, a digital audio recorder, a digital audio player, a digital picture recorder, a digital picture player, a digital video recorder and a digital video player. In some embodiments, the host device may include a portable electronic device such as a mobile phone, a smart phone, an e-book, an MP3 player, a portable multimedia player (PMP), and a portable game player.

The semiconductor memory devices 200 may store data to be accessed by the host device.

The semiconductor memory devices 200 may be implemented with a volatile memory device such as a dynamic random access memory (DRAM) and a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM) and a resistive RAM (RRAM).

The memory controller 100 may control storage of data in the semiconductor memory devices 200. For example, the memory controller 100 may control the semiconductor memory devices 200 in response to a request from the host device. The memory controller 100 may provide the data read from the semiconductor memory devices 200, to the host device, and store the data provided from the host device into the semiconductor memory devices 200.

The memory controller 100 may include a storage unit 110, a control unit 120, the error correction code (ECC) unit 130, a host interface 140 and a memory interface 150, which are coupled through a bus 160.

The storage unit 110 may serve as a working memory of the memory system and the memory controller 100, and store data for driving the memory system and the memory controller 100. When the memory controller 100 controls operations of the semiconductor memory devices 200, the storage unit 110 may store data used by the memory controller 100 and the semiconductor memory devices 200 for such operations as read, write, program and erase operations.

The storage unit 110 may be implemented with a volatile memory. The storage unit 110 may be implemented with a static random access memory (SRAM) or a dynamic random access memory (DRAM). As described above, the storage unit 110 may store data used by the host device in the semiconductor memory devices 200 for the read and write operations. To store the data, the storage unit 110 may include a program memory, a data memory, a write buffer, a read buffer, a map buffer, and so forth.

The control unit 120 may control general operations of the memory system, and a write operation or a read operation for the semiconductor memory devices 200, in response to a write request or a read request from the host device. The control unit 120 may drive firmware, which is referred to as a flash translation layer (FTL), to control the general operations of the memory system. For example, the FTL may perform operations such as logical to physical (L2P) mapping, wear leveling, garbage collection, and bad block handling. The L2P mapping is known as logical block addressing (LBA).

The ECC unit 130 may detect and correct errors in the data read from the semiconductor memory devices 200 during the read operation. The ECC unit 130 may not correct error bits when the number of the error bits is greater than or equal to a threshold number of correctable error bits, and may output an error correction fail signal indicating failure in correcting the error bits.

In some embodiments, the ECC unit 130 may perform an error correction operation based on a coded modulation such as a low-density parity check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), a Block coded modulation (BCM), and so on. The ECC unit 130 may include all circuits, systems or devices for the error correction operation.

The host interface 140 may communicate with the host device through one or more of various interface protocols such as a universal serial bus (USB), a multi-media card (MMC), a peripheral component interconnect express (PCI-E), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the memory controller 100 and the semiconductor memory devices 200 to allow the memory controller 100 to control the semiconductor memory devices 200 in response to a request from the host device. The memory interface 150 may generate control signals for the semiconductor memory devices 200 and process data under the control of the CPU 120. When the semiconductor memory devices 200 is a flash memory such as a NAND flash memory, the memory interface 150 may generate control signals for the memory and process data under the control of the CPU 120.

The semiconductor memory devices 200 may include a memory cell array 210, a control circuit 220, a voltage generation circuit 230, a row decoder 240, a page buffer 250, a column decoder 260, and an input/output circuit 270. The memory cell array 210 may include a plurality of memory blocks 211 and may store data therein. The voltage generation circuit 230, the row decoder 240, the page buffer 250, the column decoder 260 and the input/output circuit 270 form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages having various levels. For example, in an erase operation, the voltage generation circuit 230 may generate operation voltages having various levels such as an erase voltage and a pass voltage.

The row decoder 240 may be connected to the voltage generation circuit 230, and the plurality of memory blocks 211. The row decoder 240 may select at least one memory block among the plurality of memory blocks 211 in response to a row address RADD generated by the control circuit 220, and transmit operation voltages supplied from the voltage generation circuit 230 to the selected memory blocks among the plurality of memory blocks 211.

The page buffer 250 is connected to the memory cell array 210 through bit lines BL (not shown). The page buffer 250 may pre-charge the bit lines BL with a positive voltage, transmit/receive data to/from a selected memory block in program and read operations, or temporarily store transmitted data, in response to a page buffer control signal generated by the control circuit 220.

The column decoder 260 may transmit/receive data to/from the page buffer 250 or transmit/receive data to/from the input/output circuit 270.

The input/output circuit 270 may transmit, to the control circuit 220, a command and an address, transmitted from an external device (e.g., the memory controller 100), transmit data from the external device to the column decoder 260, or output data from the column decoder 260 to the external device, through the input/output circuit 270.

The control circuit 220 may control the peripheral circuit in response to the command and the address.

Figure 3:
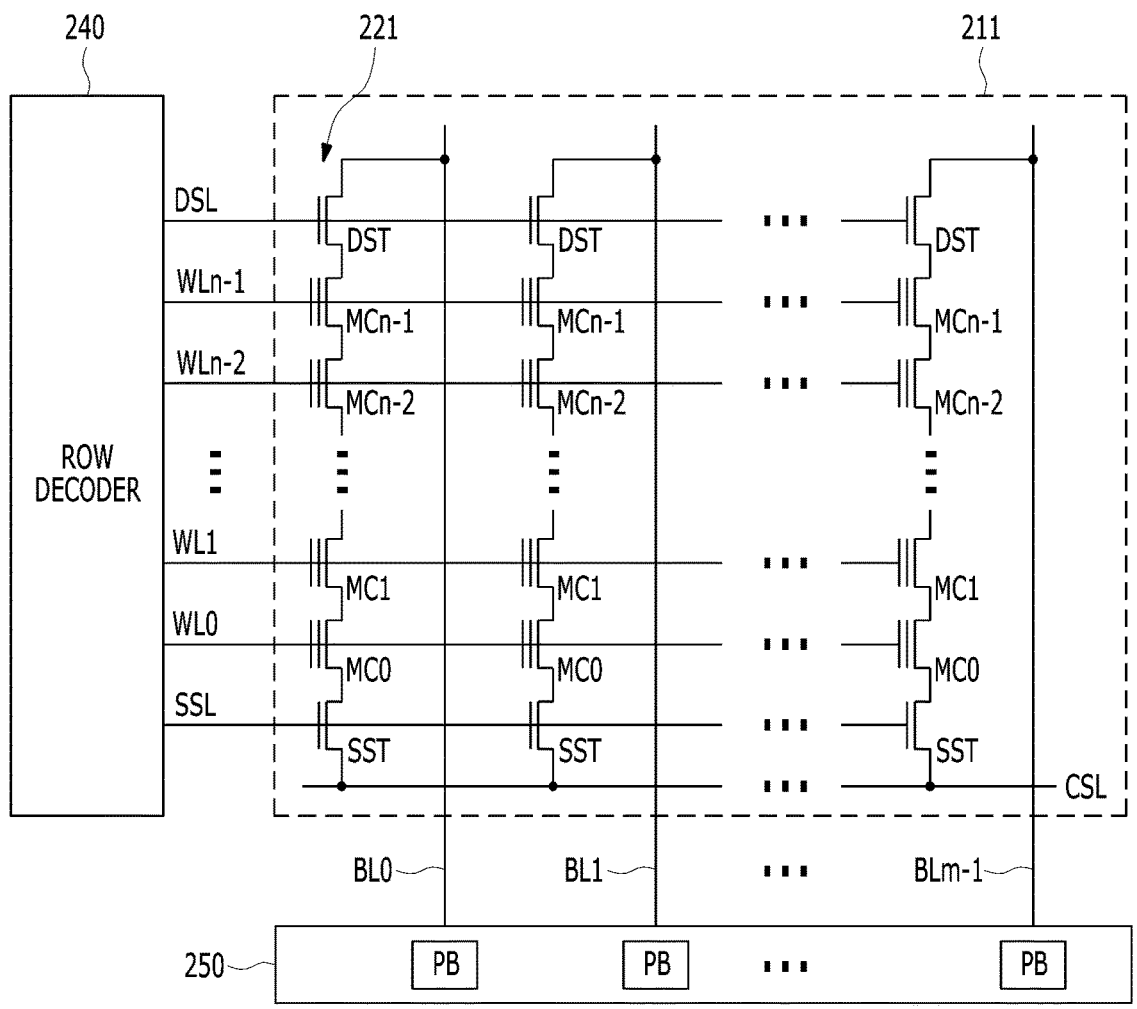
FIG. 3 is a circuit diagram illustrating a memory block of semiconductor memory devices in accordance with an embodiment of the present invention.

Referring now to FIG. 3, herein is shown a circuit diagram illustrating a memory block of semiconductor memory devices 200 in accordance with an embodiment of the present invention. For example, a memory block of FIG. 3 may be the memory blocks 211 of the memory cell array of the semiconductor memory devices 200 shown in FIG. 2.

The memory blocks 211 may include a plurality of cell strings 221 coupled to bit lines BL0 to BLm−1, respectively. The cell string of each column may include one or more drain selection transistors (DST) and one or more source selection transistors (SST). A plurality of memory cells or memory cell transistors may be serially coupled between the DSTs and SSTs. Each of the memory cells MC0 to MCn−1 may be formed of a multi-level cell (MLC) storing data information of multiple bits in each cell. The cell strings 221 may be electrically coupled to the corresponding bit lines BL0 to BLm−1, respectively.

In some embodiments, the memory blocks 211 may include a NAND-type flash memory cell. However, the memory blocks 211 are not limited to the NAND flash memory, but may include NOR-type flash memory, hybrid flash memory in which two or more types of memory cells are combined, and one-NAND flash memory in which a controller is embedded inside a memory chip.

Figure 4:
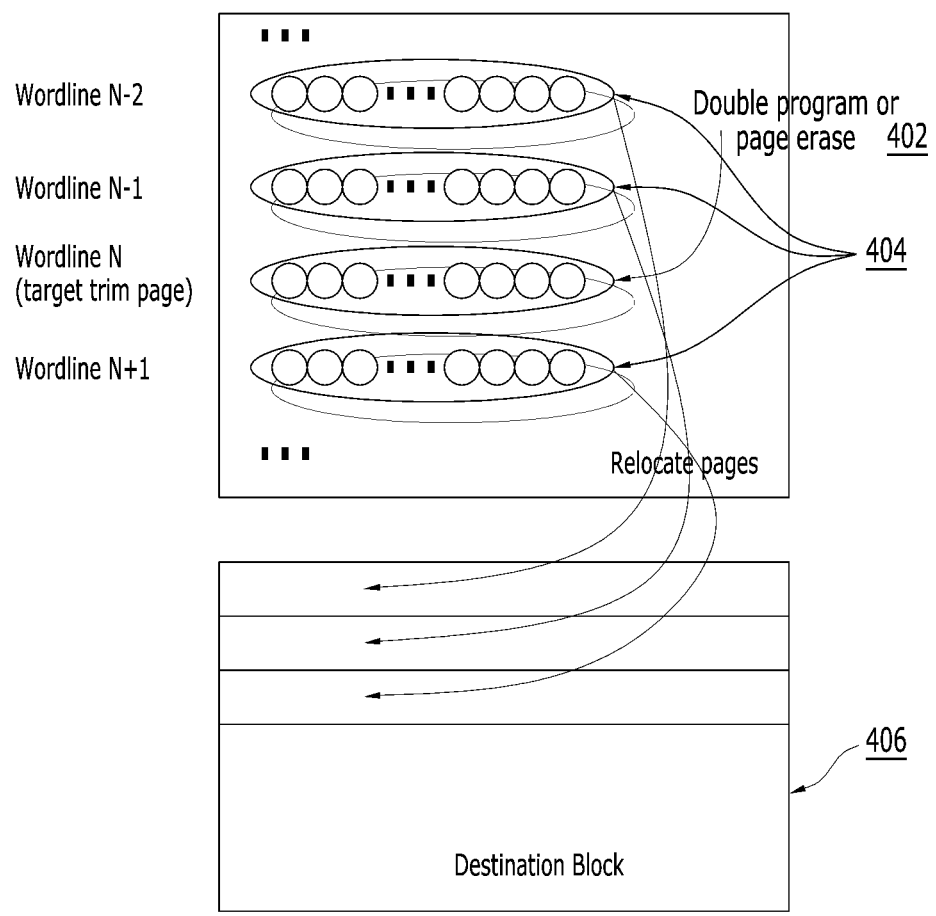
FIG. 4 is a diagram schematically illustrating double programming or page erase schemes in accordance with an embodiment of the present invention.

Referring now to FIG. 4, herein is shown a diagram schematically illustrating double programming or page erase schemes in accordance with an embodiment of the present invention.

For normal SSD operations, a NAND flash can only be programmed sequentially within a block, and each page can only be programmed once. To write new contents to a page, the entire block must be erased first. For the purpose of erasing a page securely, corrupting the page intentionally so that the page cannot be read back may be good enough. There may be various ways to corrupt a page within the block. One possible way can be programming the page more than once, such as double programming, and the other possible way may be erasing at the page level.

When a page is programmed more than once, the contents of the page can be corrupted and cannot be recovered. Some NAND flashes may reject double programming automatically, especially when the most significant bit (MSB) page is already programmed. To double program a page in such devices, some internal test mode command may be required.

Double programming a page in a NAND flash may violate the basic requirements of such a device. The page may be programmed out of sequence if the page to be erased, such as a target page, is not the last page programmed in the block. As a result, neighboring word lines of the target page may be corrupted as well. This problem needs to be addressed for the double programming scheme to work. For multi-level cell (MLC) or triple-level cell (TLC) devices, the pages that reside on the same word line with the target page can be corrupted as well and need to be relocated.

A test mode internal command may be required for erasing at the page level, which may not be a supported operation for the NAND flash. Pages that share the same word line with the target page and neighboring pages thereof can also be affected by the page level erase operation. Those pages must be relocated before the page level erase is performed to protect the data from being corrupted.

As shown in FIG. 4, a target trim page 402 needs to be delete from the storage device. The target trim page 402 is located at wordline N, wherein N is an integer greater than 0. Pages 404 of adjacent wordlines N−1, N−2, or N+1 may be corrupted if the double programming or page level erasing performed on the target trim page 402. To preserve the data from being corrupted, the pages 404 can be relocated to a destination block 406, before the double programming operation or page level erasing operation can be performed on the target page 402.

Which pages of adjacent wordlines may be corrupted and need to be related can be predetermined by the manufacture of the memory system. For example, in the embodiment of the present invention, the wordlines of N+1, N−1, and N−2 adjacent to the target page of wordline N are configured as corrupted pages and need to be relocated.

Alternatively, erase of a portion of the block, such as a quarter block erase, a half block erase, or a sub-block erase can be performed following the same principal above of the page level erase of a specific page or pages.

Figure 5:
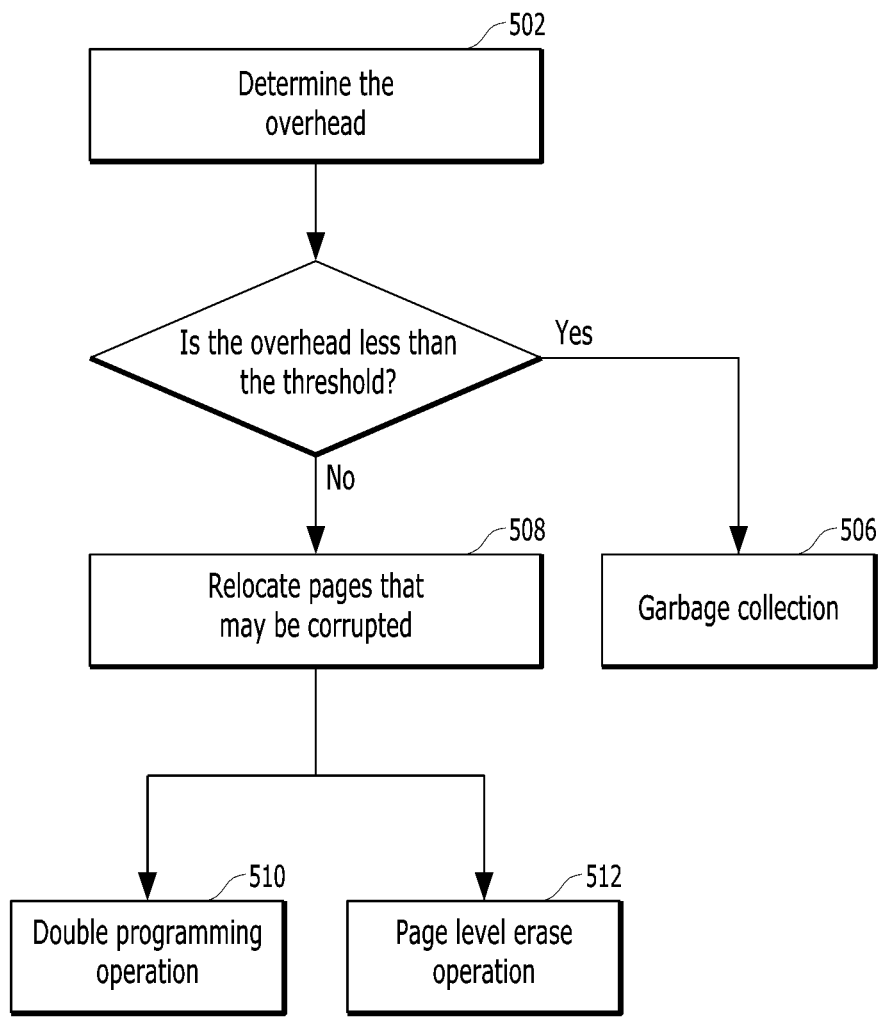
FIG. 5 is a flowchart illustrating a secure erase command scheme in accordance with an embodiment of the present invention.

Referring now to FIG. 5, herein is shown a flowchart illustrating a secure erase command scheme in accordance with an embodiment of the present invention.

A file level secure erase algorithm is presented, which is named as Secure TRIM. The Secure TRIM command can be called by a host driver as a vendor unique (VU) command that uses the same parameters as a regular TRIM command, such as a deallocate operation of the Dataset Management command in the NVMe.

The Secure TRIM algorithm of the Secure TRIM command can use regular TRIM processing algorithm if the overhead of the garbage collection on the target block is small. When the overhead of the garbage collection on the target block is not small, internal NAND commands of the double programming pages or the page level erasing of the NAND can be used. The neighboring pages that may be affected by the Secure TRIM operation may be relocated prior to the Secure TRIM operation is performed. A predetermined threshold may be configured in accordance with the memory system to determine if the overhead of the garbage collection on the target block is small. The predetermined threshold might be adjusted during in accordance with the Secure TRIM operations.

When a host deletes a file and wants to guarantee that the contents of the deleted file cannot be read back, the host can issue the Secure TRIM commands, wherein the secure TRIM commands can include a plurality of parameters. When the host device receives the commands, as shown in FIG. 5, the following procedure of the Secure TRIM command can be performed.

1. In step 502, determines the overhead, such as the number of valid pages within the physical block that the trimmed pages or deleted pages belong to. The memory system can utilize various parameters as the overhead for evaluation and determination of which erase operation may be performed. In the embodiment of the current invention, the number of valid pages can be used as the overhead.

2. If the number of valid pages is below the predetermined threshold, forces the garbage collection operation of the block in step 506.

3. If the number of valid pages is over the predetermined threshold, relocates pages that may be corrupted to other blocks in step 508. Pages that may be corrupted and need relocation can include the pages on the same word line, and pages on neighboring word lines as the target page. Details of the pages that may be affected can be provided by NAND flash manufacturer, and possibly can be adjusted.

4. Perform either double programming operation in step 510, or page level erase operation in step 512 described above, on the target pages to be trimmed. Various methods can be used to determine whether the double programming operation or the page level erase operation may be performed, in accordance with the memory system configuration.

5. Mark the target page as "trimmed" in the LBA table.

It has been discovered secure erase at a file level can optimize the performance of the memory system. Selecting an appropriate erasing operation, such as garbage collection, double programming, or page/file level erasing, for securely deleting at a page level of a storage in accordance with overhead thereof can reduce operation time, resulting in maximum of the performance of the memory system.

Figure 6:
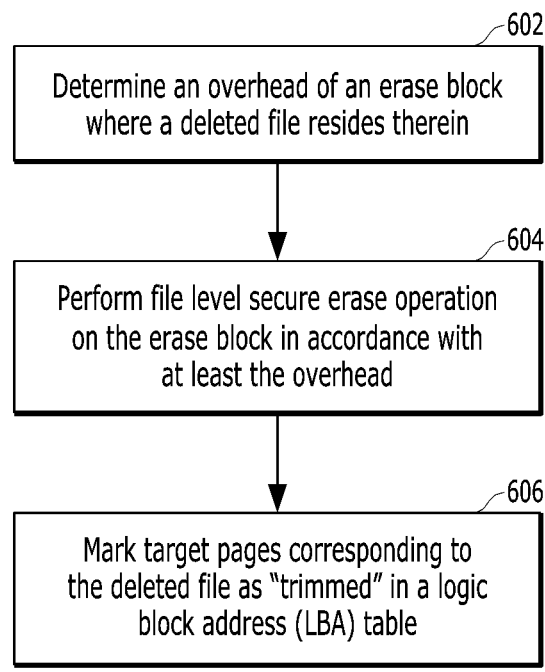
FIG. 6 is a flowchart illustrating an operating method of the memory system in accordance with an embodiment of the present invention.

Referring now to FIG. 6, herein is shown a flowchart illustrating an operating method of the memory system in accordance with an embodiment of the present invention. A method of operating a semiconductor memory system comprising: determining an overhead of an erase block where a deleted file resides therein in a block of 602; performing file level secure erase operation on the erase block in accordance with at least the overhead in a block of 604; and marking target pages corresponding to the deleted file as "trimmed" in a logic block address (LBA) table in a block of 606.

Another important aspect of the present invention is that it valuably supports and services the historical trend of reducing costs, simplifying systems, and increasing performance. These and other valuable aspects of the present invention consequently further the state of the technology to at least the next level.

While the invention has been described in conjunction with a specific best mode, it is to be understood that many alternatives, modifications, and variations will be apparent to those skilled in the art in light of the foregoing description. Accordingly, it is intended to embrace all such alternatives, modifications, and variations that fall within the scope of the included claims. All matters hitherto fore set forth herein or shown in the accompanying drawings are to be interpreted in an illustrative and non-limiting sense.

What is claimed is:

1. An apparatus of a memory system comprising:
   a plurality of memory devices, wherein each of the plurality of memory devices includes a plurality of blocks, and each of the plurality of blocks has multiple pages corresponding to multiple wordlines, respectively; and
   a memory controller coupled with the plurality of memory devices, wherein the memory controller is configured to:
   determine an overhead of an erase block where a deleted file resides therein, wherein the overhead includes determining a number of valid pages within a physical block where deleted pages of the deleted file reside;
   perform one of a plurality of types of file level secure erase operations on the erase block based on at least the determined overhead, and
   mark target pages corresponding to the deleted file as "trimmed" in a logic block address (LBA) table.

2. The apparatus recited in claim 1 wherein the file level secure erase operation includes a forced garbage collection operation that is performed on the erase block when the overhead is less than a predetermined threshold.

3. The apparatus recited in claim 1 further comprising relocating select pages to blocks other than the erase block when the overhead is greater than a predetermined threshold, before the file level secure erase operation is performed.

4. The apparatus recited in claim 3 wherein the select pages include pages that are potentially subject to being corrupted when the file level secure erase operation is performed.

5. The apparatus recited in claim 3 wherein the select pages include pages on a same wordline and pages on neighboring wordlines of the target pages.

6. The apparatus recited in claim 3 wherein the select pages are predetermined in accordance with the memory system.

7. The apparatus recited in claim 3 wherein the file level secure erase operation includes a double programming operation.

8. The apparatus recited in claim 3 wherein the file level secure erase operation includes a page level erase operation.

9. A method of operating a memory system comprising:
   determining an overhead of an erase block where a deleted file resides therein, wherein the overhead includes determining a number of valid pages within a physical block in which deleted pages of the deleted file reside;
   performing one of a plurality of types of file level secure erase operations on the erase block based on at least the determined overhead; and
   marking target pages corresponding to the deleted file as "trimmed" in a logic block address (LBA) table.

10. The method recited in claim 9 wherein the performing the file level secure erase operation includes performing a forced garbage collection operation on the erase block when the overhead is less than a predetermined threshold.

11. The method recited in claim 9 further comprising relocating select pages to blocks other than the erase block when the overhead is greater than a predetermined threshold, before performing the file level secure erase operation.

12. The method recited in claim 11 wherein the select pages includes pages that are potentially subject to being corrupted when the file level secure erase operation is performed.

13. The method recited in claim 11 wherein the select pages includes pages on a same wordline and pages on neighboring wordlines of the target pages.

14. The method recited in claim 11 wherein the select pages are predetermined in accordance with the memory system.

15. The method recited in claim 11 wherein the performing the file level secure erase operation includes performing a double programming operation.

16. The method recited in claim 11 wherein the performing the file level secure erase operation includes performing a page level erase operation.

17. A memory system comprising:
   a processor;
   a non-transitory computer readable storage medium coupled to the processor, embedding a computer program product including computer instructions, that when executed by the processor, cause the memory system to:
   determine an overhead of an erase block where a deleted file resides therein, wherein the overhead includes determining a number of valid pages within a physical block where deleted pages of the deleted file reside;
   perform one of a plurality of types of file level secure erase operations on the erase block based on at least the determined overhead, and mark target pages corresponding to the deleted file as "trimmed" in a logic block address (LBA) table.

* * * * *